United States Patent [19]
Kornfeld et al.

[11] Patent Number: 5,495,394
[45] Date of Patent: Feb. 27, 1996

[54] THREE DIMENSIONAL DIE PACKAGING IN MULTI-CHIP MODULES

[75] Inventors: Bruce E. Kornfeld, San Diego; Arthur R. Alexander, Valley Center, both of Calif.

[73] Assignee: AT&T Global Information Solutions Company, Dayton, Ohio

[21] Appl. No.: 361,062

[22] Filed: Dec. 19, 1994

[51] Int. Cl.$^6$ ............................. H05K 1/14; H05K 1/18; H05K 1/11; H01R 4/58

[52] U.S. Cl. .................. 361/764; 174/252; 174/255; 361/761; 361/783; 361/784; 361/790; 361/792; 361/795; 361/803; 439/66; 439/91

[58] Field of Search ............................ 174/252, 254, 174/255, 250, 253; 361/761, 764, 792–795, 785, 784, 760, 762, 763, 777, 783, 790, 787, 803, 789; 257/678, 723, 724, 700, 712, 713; 439/47, 65, 66, 67, 68, 69, 74, 77, 91

[56] References Cited

U.S. PATENT DOCUMENTS

| | | | |
|---|---|---|---|
| 5,172,303 | 12/1992 | Bernardoni et al. | 361/785 |
| 5,241,456 | 8/1993 | Marcinkiewicz et al. | 361/792 |
| 5,290,971 | 3/1994 | Hamaguchi et al. | 361/784 |
| 5,371,654 | 12/1994 | Beaman et al. | 361/792 |

FOREIGN PATENT DOCUMENTS

| | | | |
|---|---|---|---|
| 3-152967 | 6/1991 | Japan | 361/764 |
| 4-18787 | 1/1992 | Japan | 361/792 |

*Primary Examiner*—Donald A. Sparks
*Attorney, Agent, or Firm*—James M. Stover

[57] ABSTRACT

A multi-chip module wherein electrical components, such as integrated circuit devices, are packaged in a three dimensional arrangement. The multi-chip module includes a first, or upper, substrate including a signal layer formed on the top surface of the substrate and at least one integrated circuit device mounted to the top surface of the substrate and electrically connected to the signal layer. The module further includes a second, or internal, substrate, also including a first signal layer formed on the top surface of the substrate and at least one integrated circuit device mounted to the top surface of the substrate and electrically connected with the signal layer formed on the top surface of the second substrate. The second substrate includes a cavity through the substrate corresponding to each integrated circuit device mounted thereto. Each integrated circuit device mounted to the second substrate is placed within its corresponding cavity so that its top and bottom surfaces are flush with the top and bottom surfaces of the second substrate. Electrical signal paths are provided through the first substrate to electrically connect the integrated circuit devices mounted to the first and second substrates, and through the first and second substrates to electrically connect the multi-chip module components and circuitry to a printed circuit board to which the module is mounted. The multi-chip module may include two, three, or more signal layers and substrates connected as described herein.

5 Claims, 4 Drawing Sheets

THREE DIMENSIONAL DIE PACKAGING IN MULTI-CHIP MODULES

The present invention relates to multi-chip modules (MCMs) for semiconductor chips and, more particularly, to a method for increasing the number of components within an MCM while reducing the lengths of signal paths between different points on the module.

BACKGROUND OF THE INVENTION

A multi-chip module (MCM) is broadly defined as any advanced semiconductor substrate which provides an interconnect path between electrical components mounted thereon. The electrical components are predominantly unpackaged integrated circuits, but may also comprise discrete circuit components such as resistors, capacitors, inductors, transistors and diodes.

With the arrival of higher speed computer processors, e.g. 66 megahertz and greater, the need to accelerate other computer functions has become evident. The slower speed of the memory bus and other peripherals, such as a coprocessor, limit the overall performance of the computer system and restrict the benefits to be gained from the higher speed processor. The incorporation of peripheral functions onto multi-chip modules provides a method for increasing the speed of those operations. However, as the processor and other component clock speeds are increased, the signal path length between processor and supporting active elements becomes more critical. Shorter distances between processor and the active elements will improve total system throughput. One way to achieve extremely close spacing is to package the die in a three dimensional fashion using internal layers within an MCM. This approach could be used for microprocessor to cache memory (SRAM) or any other bare die interconnect where path length is critical for sustaining rapid execution of processor instructions.

OBJECTS OF THE INVENTION

It is therefore an object of the present invention to provide a new and useful package for a multi-chip module (MCM).

It is another object of the present invention to provide such an MCM package providing closer placement of MCM components within the multi-chip module than presently known MCM packages.

It is yet another object of the present invention to provide such an MCM package having shorter signal lengths between the MCM components than presently known MCM packages.

It is still a further object of the present invention to provide a new and useful multi-chip module wherein MCM components are arranged in multiple layers within the MCM module.

It is an additional object of the present invention to provide a new and useful multi-chip module wherein MCM components are arranged in three dimensions within the module to reduce signal lengths between the components.

SUMMARY OF THE INVENTION

There is provided, in accordance with the present invention, a multi-chip module wherein electrical components, such as integrated circuit devices, are packaged in a three dimensional arrangement. The multi-chip module includes a first, or upper, substrate including a signal layer formed on the top surface of the substrate and at least one integrated circuit device mounted to the top surface of the substrate and electrically connected to the signal layer. The module further includes a second, or internal, substrate, also including a first signal layer formed on the top surface of the substrate and at least one integrated circuit device mounted to the top surface of the substrate and electrically connected with the signal layer formed on the top surface of the second substrate. The second substrate includes a cavity through the substrate corresponding to each integrated circuit device mounted thereto. Each integrated circuit device mounted to the second substrate is placed within its corresponding cavity so that its top and bottom surfaces are flush with the top and bottom surfaces of the second substrate. Electrical signal paths are provided through the first substrate to electrically connect the integrated circuit devices mounted to the first and second substrates, and through the first and second substrates to electrically connect the multi-chip module components and circuitry to a printed circuit board to which the module is mounted. The multi-chip module may include two, three, or more signal layers and substrates connected as described herein.

The above and other objects, features, and advantages of the present invention will become apparent from the following description and the attached drawings.

DETAILED DESCRIPTION OF THE PREFERRED EMBODIMENT

Three implementations of three-dimensional MCM die packaging are presented below: (1) a single-layer common die package, (2) a dual-layer common die package, and (3) a dual-layer dissimilar die package.

Single Layer Common Die MCM Package

Figure 1:
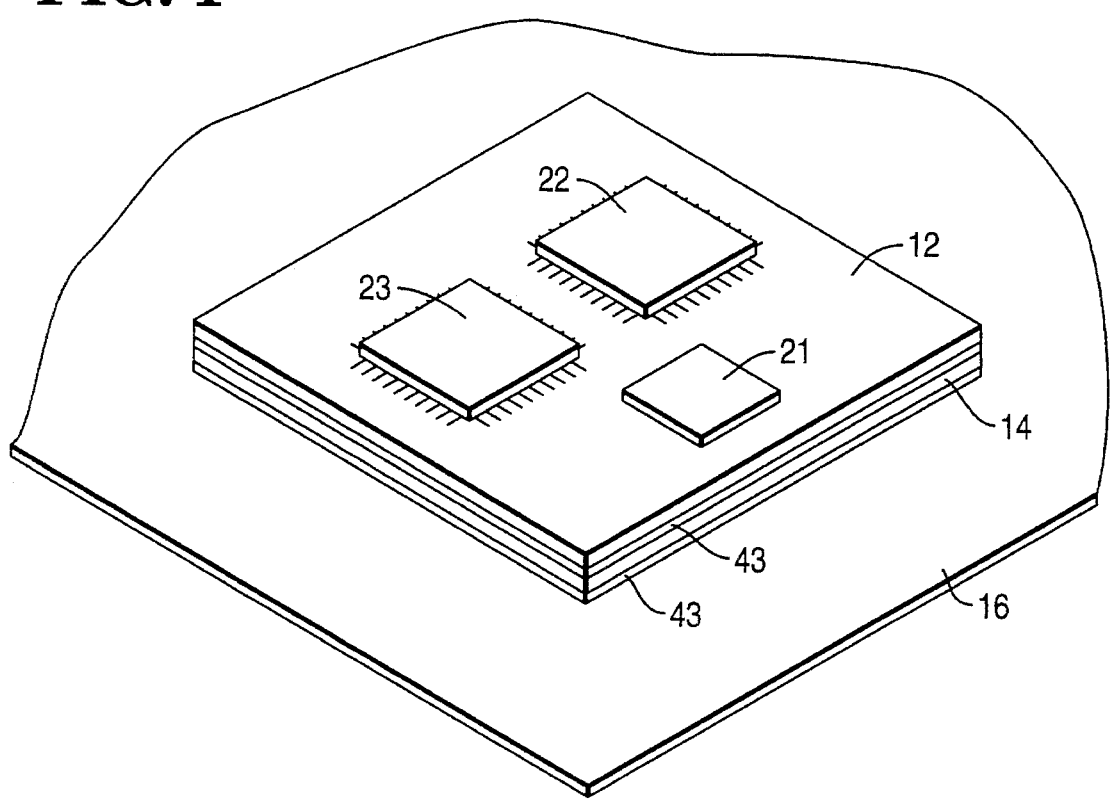
FIG. 1 is an isometric view of a multi-chip module including an internal layer and having MCM components packaged in a three-dimensional manner in accordance with the present invention.
Figure 2:
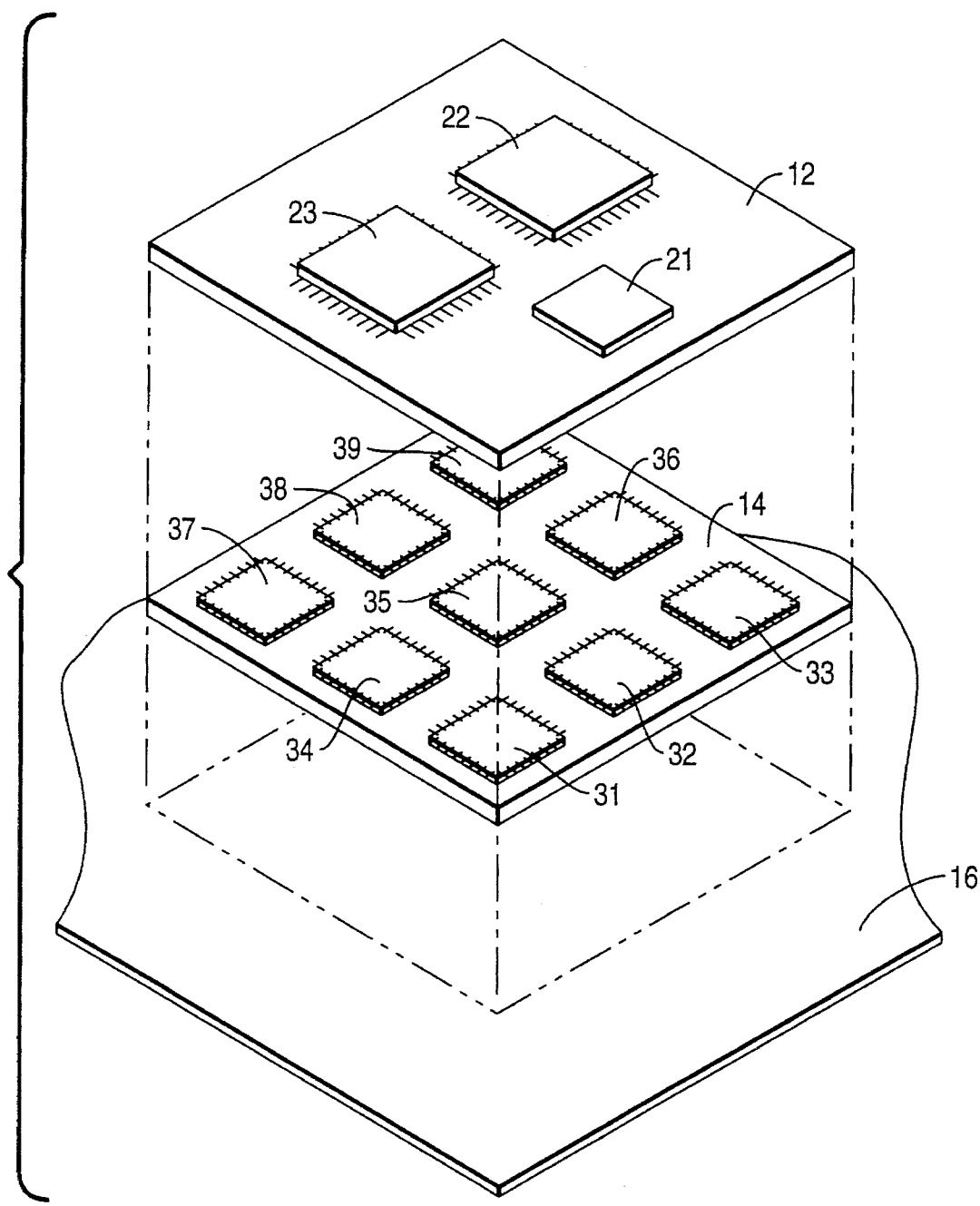
FIG. 2 is an exploded isometric view of the multi-chip module shown in FIG. 1.

FIGS. 1 and 2 illustrate a single layer common die three-dimensional package for a multi-chip module in isometric and exploded isometric views, respectively. The package is seen to include a first, or upper, substrate 12 and a second, or lower substrate 14. The thickness $t_{S1}$ of the first substrate, and the thickness $t_{S2}$ of the second substrate are the same ($t_{S1}=t_{S2}$). Integrated circuit devices 21, 22 and 23 are mounted to the top surface of upper substrate 12 using conventional mounting techniques such a TAB or BGA mounting processes. Integrated circuit devices 21, 22 and 23 may also be electrically connected through signal paths formed on the upper surface of substrate 12 or through plated vias to signal paths residing within signal layers internal to substrate 12.

Several integrated circuit devices 31 through 39, having similar thickness, are attached to the lower substrate 14 using Flip-TAB mounting techniques. Flip-TAB mounted devices 31 through 39 reside in cavities formed into the top surface of lower substrate 14. Integrated circuit devices 31 through 39 may be electrically connected through signal paths formed on the upper surface of substrate 14 or through plated vias and signal paths residing within signal layers internal to substrate 14.

Figure 3:
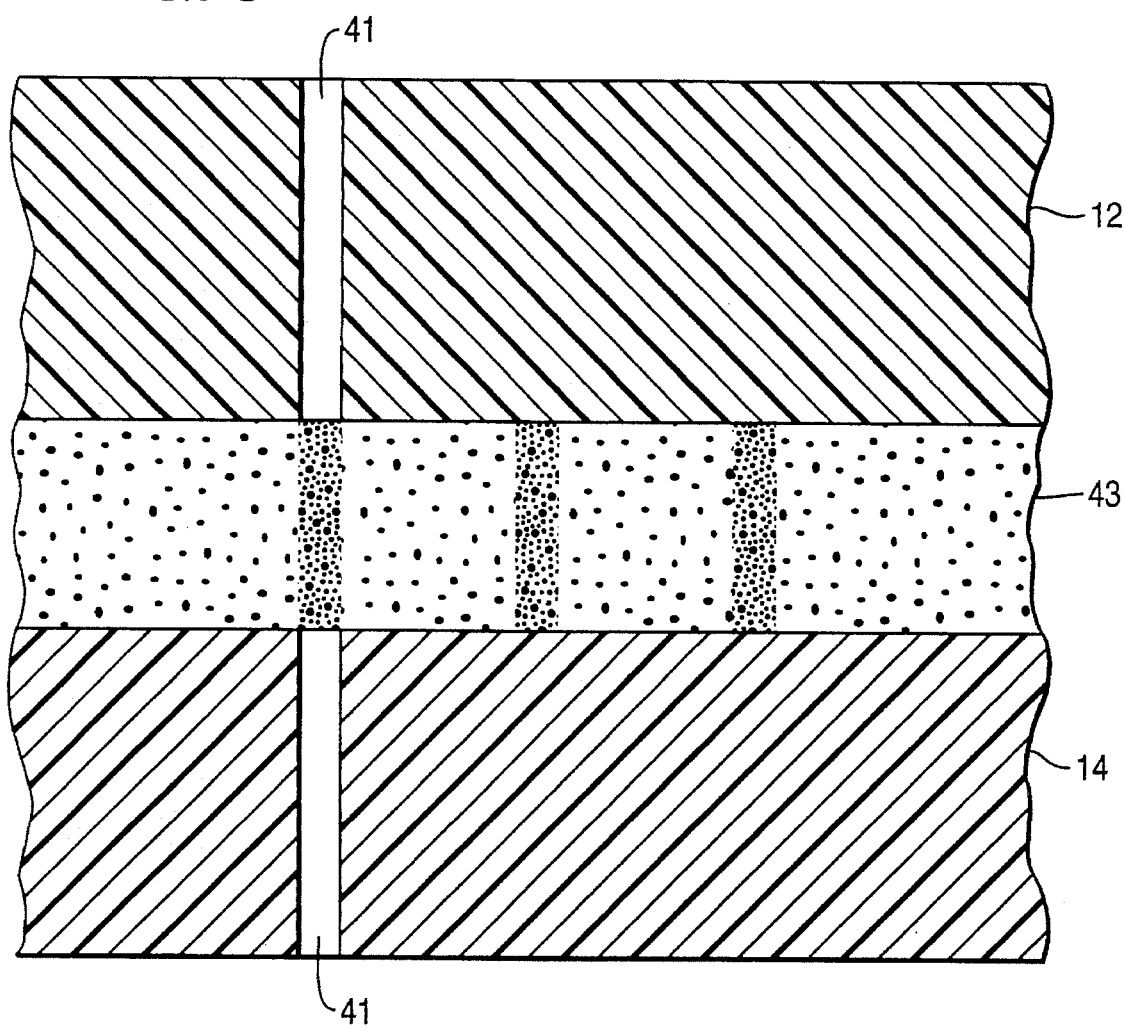
FIG. 3 is a sectional view of the multi-chip module shown in FIG. 1, showing the electrical interconnections between MCM layers and a motherboard to which the MCM is attached.

Electrical connections between (1) the signal layers contained on the surface and internal to substrate 12, and (2) the signal layers contained on the surface and internal to substrate 14 are provided by plated vias 41 formed through the substrate layers and antisotrophic material 43 provided between upper and lower substrates 12 and 14. Signal paths are thereby established between the integrated circuit components mounted to the two substrates by the electrical connections between the substrates. Similarly, plated vias and antisotrophic materials are utilized to provide electrical connections between the upper and lower substrates and a motherboard 16 to which the MCM module is mounted. A sectional view of the multi-chip module, showing the electrical interconnections between the MCM substrate layers and motherboard 16 is provided in FIG. 3.

Figure 4:
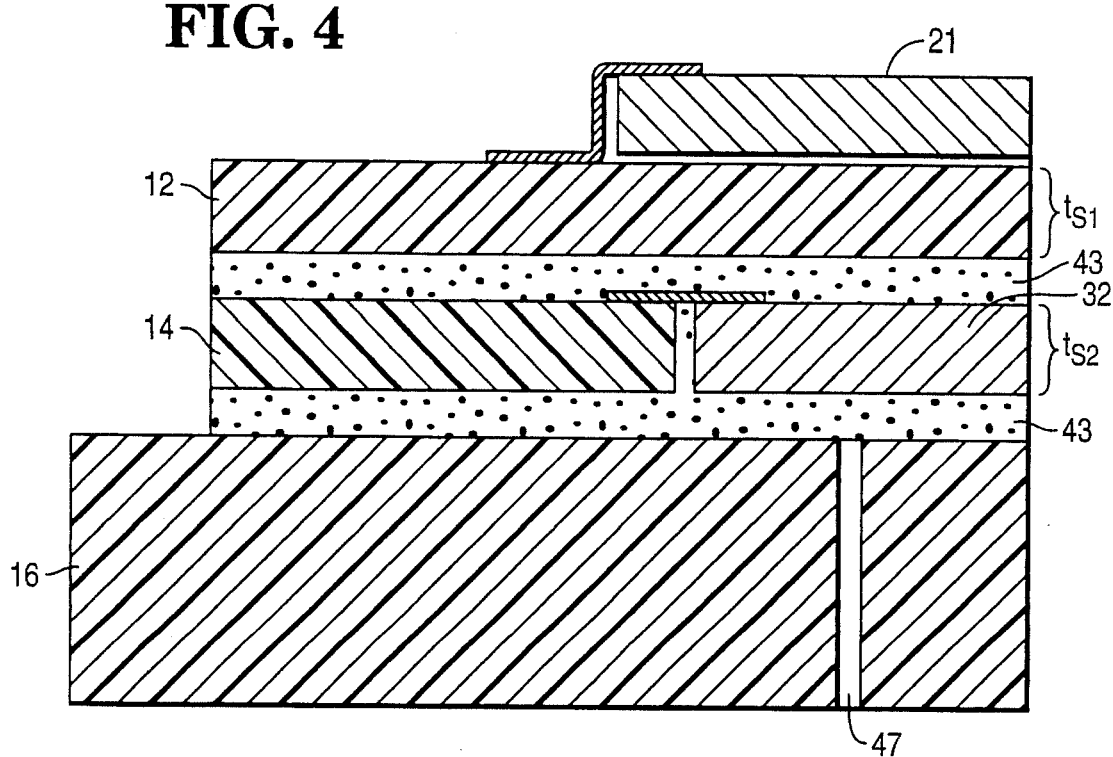
FIG. 4 is a cross-sectional view of the multi-chip module of FIG. 1.

FIG. 4 is a cross-sectional view of the multi-chip module of FIG. 1. The cross-sectional view shows a portion of integrated circuit device 21 TAB mounted to the surface of upper substrate 12, and a portion of integrated circuit device 32 Flip-TAB mounted within a cavity in lower substrate 14. Antisotrophic material 43 is provided between the upper and lower substrates, as well as between the lower substrate and printed circuit board 16.

In order to provide thermal conductivity, the thickness $t_{S2}$ of lower substrate 14 must be equal to the thickness of integrated circuit devices 31 through 39 embedded therein. This allows for the integrated circuit device package to make contact with thermal vias, such as via 47, on the motherboard, or on another layer of the MCM which connects to a layer possessing sufficient thermal capacity. As shown in FIG. 4, the outer signal layer of the MCM formed on the top surface of upper substrate 12, and the buried signal layer formed on the top surface of lower substrate 14, are only separated by the thickness $t_{S1}$ of the upper substrate plus the thickness of the antisotrophic material.

Dual Layer Common Die MCM Package

Figure 5:
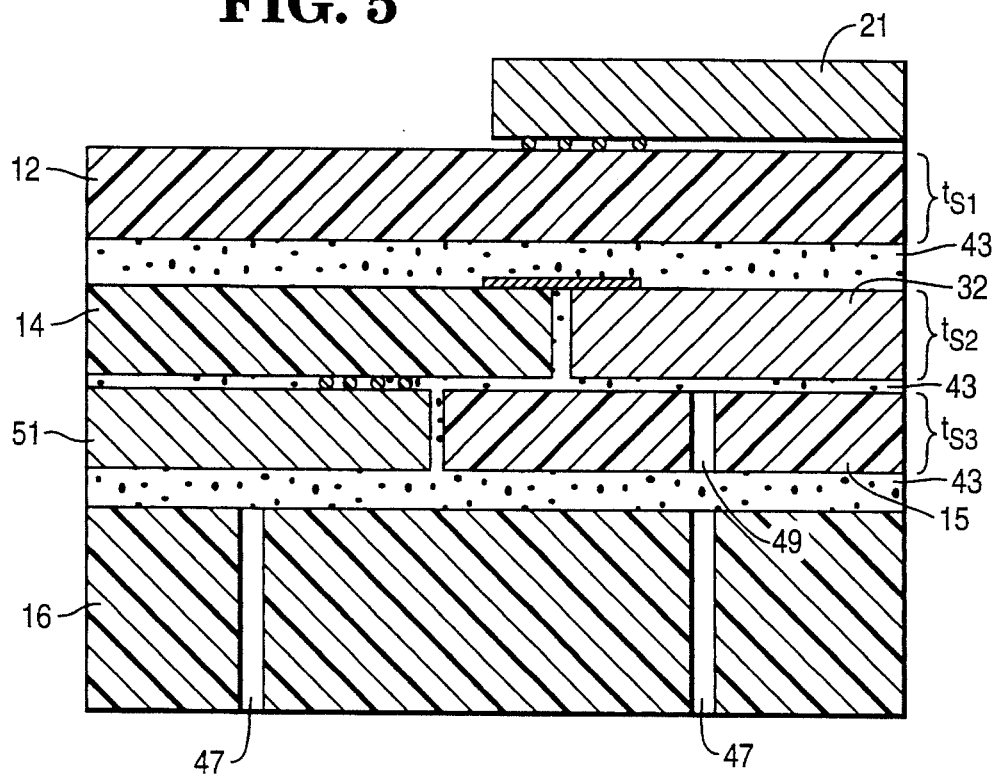
FIG. 5 is a cross-sectional view of a multi-chip module including multiple internal layers and having MCM components packaged in a three-dimensional manner in accordance with a second embodiment of the present invention.

FIG. 5 illustrates, in cross-sectional view, a three-dimensional multi-chip module package including dual internal layers in accordance with a second embodiment of the present invention. This dual-layer common die MCM package includes integrated circuit devices, such as devices 32 and 51, attached to both the top and bottom surfaces of internal substrate 14, respectively. Similar thickness integrated circuit devices are attached to the top surface of internal substrate 14 using Flip-TAB attachment techniques, where the thickness $t_{S2}$ of the substrate must be equal to the thickness of the embedded integrated circuit devices. Another layer of similar thickness integrated circuit device is attached to the bottom surface of inner substrate 14 using any die attachment method, such as BGA attachment techniques. As with the single layer common die three-dimensional package discussed above, the thickness $t_{S1}$ of the first substrate, and the thickness $t_{S2}$ of the second substrate are the same ($t_{S1}= t_{S2}$).

The three-dimensional MCM package implementation shown in FIG. 5 includes an additional substrate 15, placed directly below substrate 14 which contains cavities to accommodate the integrated circuit devices attached to the bottom surface of substrate 14. The thickness $t_{S3}$ of this layer must be equal or greater than the thickness of the integrated circuit devices attached to the bottom surface of substrate 14. Again, antisotrophic material 43 is used to make electrical connections between the individual substrates within the MCM as well as between the MCM and motherboard 16.

Similar to the single-layer common die package discussed earlier, thermal vias, such as vias 47 and 49, are provided through the motherboard and substrate 15, respectively, to make contact to the internal integrated circuit devices. This implementation yields signal path lengths equal to the thickness of the upper die only.

Dual Layer Dissimilar Die MCM Package

The dual-layer dissimilar die MCM package is identical to the dual-layer common die MCM package discussed above except that the thickness of substrates 12, 14 and 15, and the devices attached thereto need not be equal, i.e., $t_{S1} \neq t_{S2} \neq t_{S3}$.

It can thus be seen that there has been provided by the present invention a method for increasing the number of components within an MCM while reducing the lengths of signal paths between different points on the module. Compared to standard die to die interconnect on external surfaces of the MCM, the three-dimensional die attachment methods described herein offer significantly shorter signal path lengths. This shortened path length will become more and more critical as clock speeds increase. An ultimate goal is to allow all busses contained in the MCM to operate at the same speed as the CPU, thereby increasing overall system throughput. In addition to describing a technique for burying integrated circuit devices within a multi-chip module, a method for managing thermal concerns for these buried devices is described.

Although the presently preferred embodiment of the invention has been described, it will be understood that various changes may be made within the scope of the appended claims. For example, all three implementations discussed above use Flip-TAB techniques to attach the embedded integrated circuit devices, but many other die attach methods could be employed for the embedded and non-embedded devices. All three implementations also use antisotrophic material for substrate to substrate and substrate to motherboard attachment. This antisotrophic material can be an adhesive if mechanical compression is not desired.

These and other variations, changes, substitutions and equivalents will be readily apparent to those skilled in the art without departing from the spirit and scope of the present invention. Accordingly, it is intended that the invention to be secured by Letters Patent be limited only by the scope of the appended claims.

What is claimed is:

1. A multi-chip module, comprising:
    a first substrate including first and second surfaces, a signal layer formed on said first surface, and at least one integrated circuit device mounted to said first surface and electrically connected to said signal layer;
    a second substrate including first and second surfaces; a first signal layer formed on the first surface of said second substrate; at least one cavity formed in said second substrate; and an integrated circuit device corresponding to each of said cavities, mounted to the first surface of said second substrate and electrically connected with said first signal layer of said second substrate; said first surface of said second substrate being attached to said second surface of said first substrate;

a plurality of electrical signal paths between the signal layers formed on the first surfaces of said first and second substrates for electrically connecting the integrated circuit devices mounted to said first and second substrates;

a second signal layer formed on the second surface of said second substrate;

at least one integrated circuit device mounted to said second surface of said second substrate and electrically connected with said second signal layer;

a plurality of electrical signal paths between said second signal layer and the signal layers formed on the first surfaces of said first and second substrates for electrically connecting the integrated circuit devices mounted to said second surface of said second substrate with the integrated circuit devices mounted to the first surfaces of said first and second substrates; and a third substrate having first and second surfaces and including a cavity corresponding to each integrated circuit device mounted to the second surface of said second substrate, the first surface of said third substrate being attached to the second surface of said second substrate such that said integrated circuit devices mounted to the second surface of said second substrate occupy the corresponding cavities in said third substrate; and wherein each integrated circuit device mounted to said second surface of said second substrate has a thickness equal to thickness of said third substrate, whereby the second surface of each integrated circuit device mounted to said second substrate is flush with the second surface of said third substrate to thereby provide thermal cooling of said integrated circuit devices mounted to said second surface of said second substrate.

2. The multi-chip module according to claim 1, wherein:

said electrical signal paths include plated vias through said first substrate.

3. The multi-chip module according to claim 2, wherein:

said electrical signal paths further include antisotrophic material provided between said first and second substrates.

4. The multi-chip module according to claim 1, wherein:

each integrated circuit mounted to the first surface of said second substrate has a thickness equal to the thickness of said second substrate, whereby the second surface of each integrated circuit mounted to said first surface of said second substrate is flush with the second surface of said second substrate; and said third substrate includes a thermal path through said third substrate thermally connecting the second surface of each integrated circuit device mounted to the first surface of said second substrate with the second surface of said third substrate.

5. The multi-chip module according to claim 4, wherein:

the thickness of said second substrate equals the thickness of said third substrate.

\* \* \* \* \*